United States Patent [19]
Wright

[11] Patent Number: 5,764,569
[45] Date of Patent: Jun. 9, 1998

[54] TEST STRUCTURE AND METHOD TO CHARACTERIZE CHARGE GAIN IN A NON-VOLATILE MEMORY

[75] Inventor: Peter J. Wright, Sunnyvale, Calif.

[73] Assignee: Altera Corporation, San Jose, Calif.

[21] Appl. No.: 806,057

[22] Filed: Feb. 25, 1997

Related U.S. Application Data

[60] Provisional application No. 60/027,027, Sep. 24, 1996.
[51] Int. Cl.⁶ .................................................. G11C 11/40
[52] U.S. Cl. .................................... 365/185.09; 365/185.1
[58] Field of Search ............................ 365/185.9, 185.1

[56] References Cited

U.S. PATENT DOCUMENTS 5,357,466  10/1994  Hong ........................ 365/185.1
5,428,571  6/1995   Atsumi ..................... 365/185.09

*Primary Examiner*—A. Zarabian
*Attorney, Agent, or Firm*—Beyer & Weaver, LLP

[57] ABSTRACT

Disclosed is a method and apparatus for charge gain characterization of non-volatile memory cells. The test structure of the present invention includes an array of non-volatile memory cells similar to that of the proposed product, but having the control gates of some or all of the cells of the array linked to form a common floating gate. In this way, charge leakage through any cell so linked will accrue in the common floating cell. Any such charge gain will be detectable through a variety of possible structures.

21 Claims, 8 Drawing Sheets

TEST STRUCTURE AND METHOD TO CHARACTERIZE CHARGE GAIN IN A NON-VOLATILE MEMORY

This application claims the benefit of the filing date of Provisional application Ser. No. 60/027,027, filed Sep. 24, 1996.

BACKGROUND OF THE INVENTION

The present invention relates generally to non-volatile semiconductor memory cell arrays. More specifically, the invention relates to an improved method and apparatus for testing memory arrays for defects.

Non-volatile memory cells retain information by holding excess charge on a floating gate or by keeping charge off of the floating gate. They are called "non-volatile" because they maintain their charge state (data) when power is removed from the device of which they are part. Examples of non-volatile memory cells include electrically programmable memory (EPROM) cells, electrically erasable/programmable memory (EEPROM) cells, and FLASH cells. A common element of all these cells is at least one charge transfer region through which electrons can be moved on to or off of the floating gate. Generally, the charging and discharging operations program the cells to values of 0 or 1, however additional values are also a possibility in proposed multi-level cell designs.

Typically, non-volatile memory cells are provided in large memory arrays in which each individual memory cell represents a bit. Such arrays will continue to grow in density, with devices including tens or hundreds of thousands of logic cells per array expected to dominate the market. Each bit in an array is accessed for programming or reading through the appropriate column or row.

As the name suggests, EEPROM cells can be both programmed and erased electrically. FLASH cells are also electrically programmable and erasable. Note that some other non-volatile memory such as EPROM cells require exposure to ultraviolet light or some other external factor for erasure. Charging or discharging (programming or erasing) is accomplished in EEPROM cells by a process known as Fowler-Nordheim tunneling in the cell's charge transfer region. Briefly, under appropriate conditions, electrons "tunnel" through a relatively thin (e.g., 80 Å) oxide layer (the "tunnel oxide") which lies between two electrodes of the EEPROM cell. One of these electrodes is the floating gate. The current through the tunnel oxide is limited by the amount of Fowler-Nordheim current, which is a strong function of the electric field across the oxide.

FIG. 1 depicts a conventional single polysilicon EEPROM cell 30. The cell includes a single polysilicon floating gate structure 32 which performs three functions. At a first end, a tunnel extension 34 of floating gate 32 acts as an electrode in the two terminal device used for tunneling electrons from a heavily doped N+ implant 35 (also referred to as a Memory Diffusion or MD) through a tunnel oxide 36 (often about 80 Å thick) onto floating gate structure 32. At the other end of this floating gate, a wide area plate 38 is employed as one electrode of a capacitor enabling the floating gate 32 to be raised to a high voltage (e.g., about 6 to 11 volts) by capacitively coupling a programming voltage (e.g., about 9 to 13 volts) from a second electrode 40 (heavily doped N+ silicon, referred to herein as a control gate memory diffusion) through an oxide 42 (often about 180 Å thick). Between these two ends is a section of polysilicon that forms the gate 44 of a read transistor.

The read transistor is connected in series with a word line transistor having a gate 46 forming part of a word line 47. The read and word line transistors separate a sense amp negative (−) input 48 from a sense amp positive (+) input 50. Charging the floating gate 32 by tunneling electrons onto it (through tunnel oxide 36) raises the threshold voltage of the read transistor (EEPROM cell 30 is programmed). This shuts off the channel between the sense amp inputs, even when the adjacent word line transistor is turned on. Tunneling electrons off the floating gate 32 reduces the read transistor threshold voltage to negative values, effectively turning this device on (EEPROM cell 30 is erased). The word line transistor in series then controls the signal path between the two sense amp inputs 48 and 50.

The EEPROM cell is programmed or erased by charging or discharging, respectively, the floating gate 32. In order to tunnel electrons onto floating gate 32, a high voltage must be applied to the control gate memory diffusion 40. At the same time, the write column 56 is grounded and the write column select line 61 is selected with, for example, 5 volts. The sense amp (−) input 48 can be biased from 5 volts to a high voltage to assist tunneling electrons onto the floating gate 32. The voltage on the control gate memory diffusion 40 is capacitively coupled to the floating gate 32 as is the sense amp (−) input 48 voltage. The resulting positive voltage on floating gate 32 is sufficient to cause tunneling onto floating gate 32 through the tunnel oxide 36, thereby programming EEPROM cell 30.

In order to tunnel electrons off floating gate 32, a high voltage must be applied to memory diffusion 35 while ground is applied to second heavily doped N+ implant 40 which underlies and is capacitively coupled to the wide area plate 38. During this process, ground is also applied to sense amp (−) input 48. The application of high voltage to memory diffusion 35 is accomplished through a write column 56 and a write column select transistor 52 including (i) a source/drain diffusion 54 conductively connected to write column 56 for data input, (ii) a source/drain diffusion 58 electrically connected to memory diffusion 35, and (iii) a gate electrode 60 forming part of write column select line 61. When a sufficient potential is applied to write column select line 61 while a write signal is applied through write column 56, electrons can tunnel off of floating gate 32 to erase the EEPROM cell.

Key to the programming and erasing processes for EEPROM cells is the tunnel oxide, or more precisely, that portion of the tunnel oxide through which electrons flow - - - sometimes referred to as a tunnel window. Under normal conditions, the tunnel oxide acts as a dielectric and does not conduct electricity. However, under high electric fields of, for example, 11 to 13 volts across the oxide, electron tunneling occurs through this oxide by the Fowler-Nordheim tunneling process.

EPROM memory cells are also programmed and erased by moving electrons across charge transfer regions. In this case, hot electrons are moved across a thicker (e.g., 200 Å) dielectric layer separating two electrodes, rather than the Fowler-Nordheim tunneling that occurs with EEPROMs. FLASH cells may be a hybrid form of EPROM and EEPROM cells that resemble EPROMs in structure and employ hot electron programming, but employ a thinner gate oxide (about 100 Å) and an asymmetric source/drain structure. The source is made deeper than the drain and the source to gate overlap is greater than the drain to gate overlap, causing a graded diffusion with a higher junction breakdown voltage. An additional discussion of EEPROMs, EPROMs, and FLASH cells can be found in the 1996 Data Book (available from Altera Corporation of San Jose, Calif.) which is incorporated herein by reference for all purposes.

A problem with the non-volatile memory is that the charge can leak between the two electrodes, leading to a loss of the stored data. This can happen in two ways - - - the excess electrons can leave the floating gate (charge loss) or additional electrons can be placed on the floating gate (charge gain). In EEPROM cells, this charge leakage often results from defects in the charge transfer region, the tunnel window.

Charge loss is well known in the art, as are effective methods for characterizing charge loss. Such methods include connecting all of the sense amp (+) and sense amp (−) connections of an array of one thousand or more bits together. The array is then programmed to a high threshold voltage and electrically or thermally stressed. Because all of the sense amp (+) and sense amp (−) connections are tied together, the lowest threshold voltage in the array can be determined using the sense amplifiers and decoders of the full product.

However, charge gain is a problem that has only more recently become important and is as yet not well characterized. This problem has been found to occur in single bits out of a large array of more than one thousand bits. Since a defect rate of one in one thousand is unacceptable in many applications, it is necessary to extensively screen various process and design criteria used to create a given memory array. After a memory array is fabricated with a candidate design/process, charge gain can be identified by individually checking each cell in the array. Typically, this checking is performed using the "full product" with sense amplifiers and decoders. In other words, each cell is individually checked using the array's existing read/write system of word lines, write columns, and sense amplifiers. Unfortunately, this approach can be difficult and time consuming, especially when numerous potential design criteria must be evaluated to identify the origin of a charge gain problem. In short, there is not presently a quick and efficient method or device for characterizing charge gain in non-volatile memory cells.

While faster and less intensive test structures are available, these have only been able to look at gross problems, such as an oxide capacitor or a series of parallel EEPROM cells, and have not been sufficient to characterize charge gain in individual cells.

Moreover, the process of manufacturing semiconductor devices is often performed at a location remote from the testing facility, particularly if the testing requires full product analysis. Once a device is designed, the design is generally sent to a foundry, sometimes overseas, where prototypes of the new device are manufactured. Only after shipping the complete product back to the home company can a charge gain problem be identified.

Accordingly, there is a need for a test method and apparatus for charge gain characterization of non-volatile memory cell designs which is reliable, efficient and economical.

SUMMARY OF THE INVENTION

The present invention provides a method and apparatus for charge gain characterization of non-volatile memory cells which is reliable, efficient and economical. The test structure of the present invention includes an array of non-volatile memory cells similar to that of a proposed product, but having portions of, the floating gates (e.g., the control gates) of some or all of the cells of the array linked to form a common floating gate. In this way, charge leakage through any cell so linked will accrue in the common floating gate. Any such charge gain will be detectable anywhere on the common floating gate through a variety of possible structures. Among the advantages of the present invention is that defects causing charge gain may be efficiently characterized during the PLD design and fabrication process.

The invention provides a structure for testing at least a portion of an array of non-volatile memory cells. The structure has a substrate including diffusion regions at least partially defining individual cells of the array of non-volatile memory cells to be tested, and one or more dielectric layers formed on the substrate. The structure also has a floating gate spanning two or more individual cells and charge transfer regions in each of two or more cells. If there is a defect in or near any of the charge transfer regions, there may be some charge transfer from the substrate through the one or more dielectric layers and onto the floating gate. Charge build up on the floating gate indicates that such a defect exists.

In a preferred embodiment of the present invention, the test structure also has a gate charge detection mechanism capable of sensing charge build up on the common floating gate. The gate charge detection mechanism preferably includes an isolated MOS transistor having for its gate the floating gate of the array. The gate charge detection mechanism may also include one or more cells of the array or it may include pads coupled to the sense amplifiers of the array.

In a preferred embodiment, the array of non-volatile memory cells to be tested is an array of EEPROM cells, each of which includes a tunnel window overlaying a memory diffusion in the substrate. The array to be tested may also be or include an array of EPROM cells or multiple flash memory cells.

The present invention also provides a method of testing at least a portion of an array of non-volatile memory cells by providing the array with a floating gate spanning two or more individual cells of the array. Charge is substantially removed from the floating gate, and one or more diffusion regions in a substrate underlying the array and capacitively coupled to the floating gate are biased. Any charge build-up on the common floating gate indicates the existence of a defect in or near a cell's charge transfer region. Charge build-up may be detected by a variety of methods including reading an isolated MOS transistor having for its gate the floating gate of the array, or by one or more cells of the array or pads coupled to the sense amplifiers of the array. The method is applicable to EEPROM, EPROM and flash memory cells.

These and other advantages of the present invention will become clear to those skilled in the art upon a study of the drawings and detailed description of the invention.

BRIEF DESCRIPTION OF THE DRAWINGS

FIGS. 3, 3A and 3B are top views of the EEPROM array of FIG. 2 adapted to form test structures in accordance with preferred embodiments of the present invention.

DETAILED DESCRIPTION OF THE PREFERRED EMBODIMENTS

The present invention will be described with reference to a preferred embodiment. It will be understood by those skilled in the art that variations of the described method and apparatus may be made without departing from the scope of the present invention. For example, while an EEPROM array is illustrated and described, the invention applies with equal relevance to other non-volatile memory arrays in which the cells employ gates. For example, the invention applies to EPROM arrays and FLASH arrays.

Figure 1:
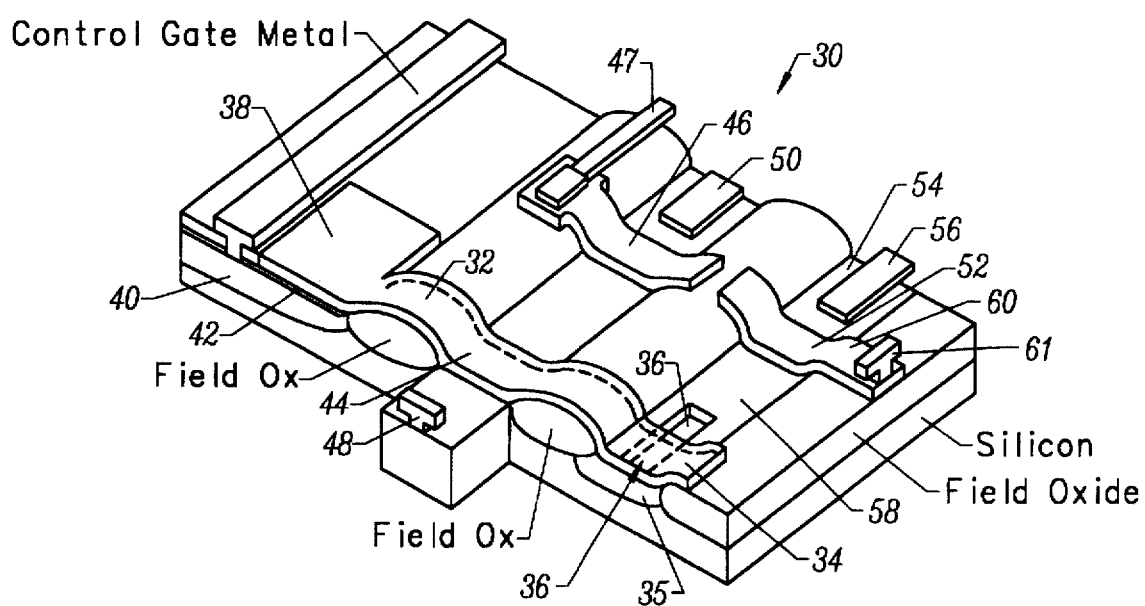
FIG. 1 is a cross-sectional perspective view of an exemplary non-volatile memory cell, a single polysilicon EEPROM cell.
Figure 2:
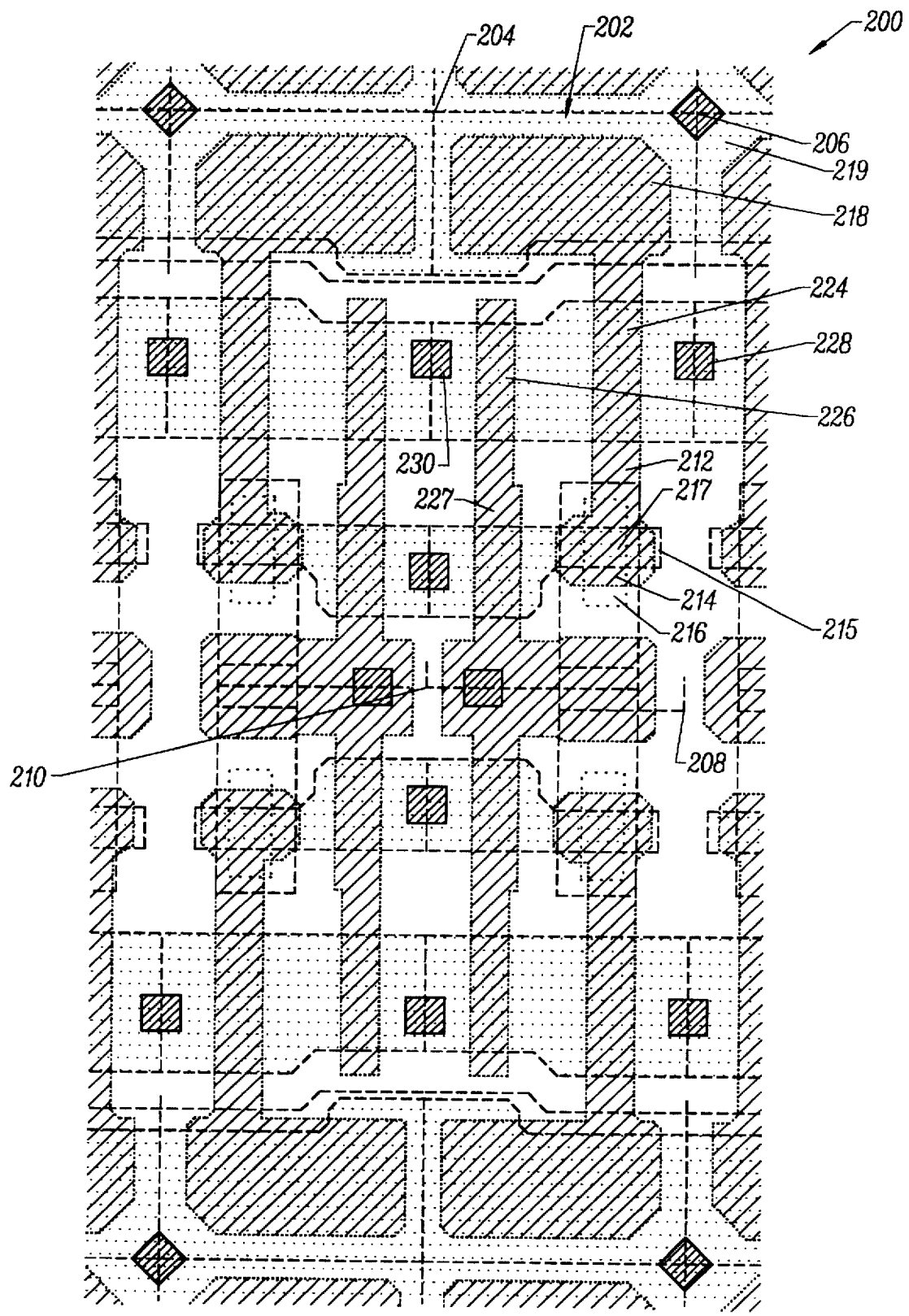
FIG. 2 is a top view of a region of an EEPROM array showing four complete cells.

FIG. 2 is an illustration of a region of an EEPROM array showing a group of four complete cells 200. A single cell 202 of the array is provided within a rectangular region defined by the four point 204, 206, 208 and 210. The cell includes a polysilicon floating gate structure 212 which performs the three functions outlined above. At a first end, a tunnel extension 214 of floating gate 212 acts as an electrode in the two terminal device used for tunneling electrons from a heavily doped $N^+$ implant 215 (the Memory Diffusion or MD described above) through that portion of a tunnel oxide 216 overlying the MD 215 (referred to as a tunnel window 217), onto floating gate structure 212. At the other end of this floating gate, a wide area plate 218 is employed as one electrode of a capacitor enabling the floating gate 212 to be raised to a high voltage (about 12 to 13 volts) by capacitively coupling to a control gate electrode 219 (heavily doped N+ silicon) through an oxide layer (not shown; often about 200 Å thick). Between these two ends is a section of polysilicon that forms the gate 224 of a read transistor. The read transistor is connected in series with a word line transistor having a gate 226 forming part of a polysilicon word line 227. The read and word line transistors separate a sense amp negative (−) input 228 from a sense amp positive (+) input 230.

Arrays of this type typically include at least hundreds or thousands of individual EEPROM cells. Once an array has been designed, it is necessary to test the new design for defects. The present invention provides a way to test such arrays for charge gain without the need for expensive and time-consuming production and testing of sample arrays by conventional methods. The invention allows Programmable Logic Device ("PLD") designers and manufacturers to modify or discard defective designs at an early stage, before the investment of resources in the production of an ultimately defective design.

In order to obtain the most reliable test results, it is desirable for an array test structure to resemble the actual proposed product to be produced as closely as possible. This is so that the design features and the process steps which go into the fabrication of the test structure are nearly identical to those for the proposed product itself. In this way, there can be reasonable assurance that the test results obtained with the test structure will correspond to the product.

Figure 3A:
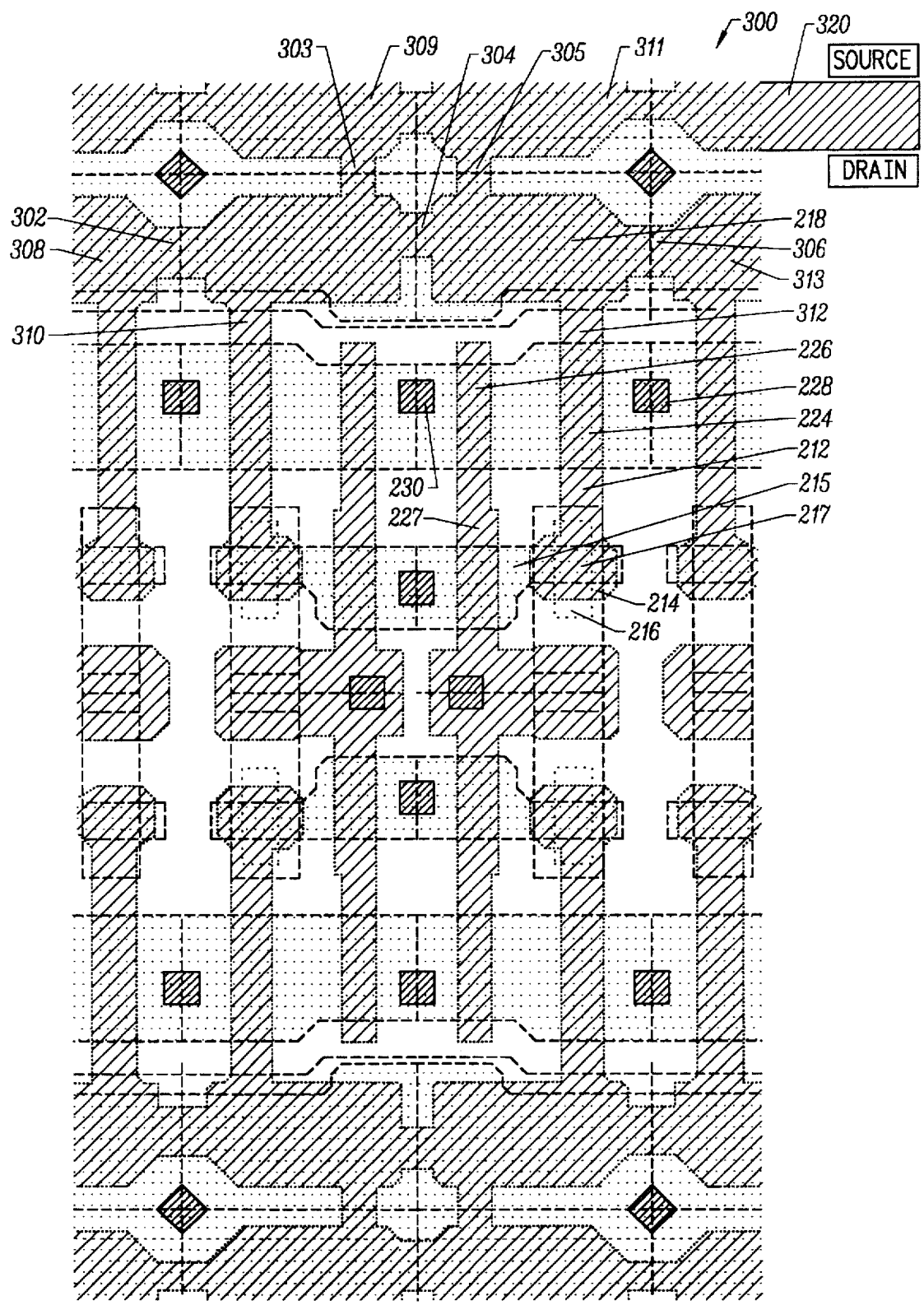
Figure 3B:
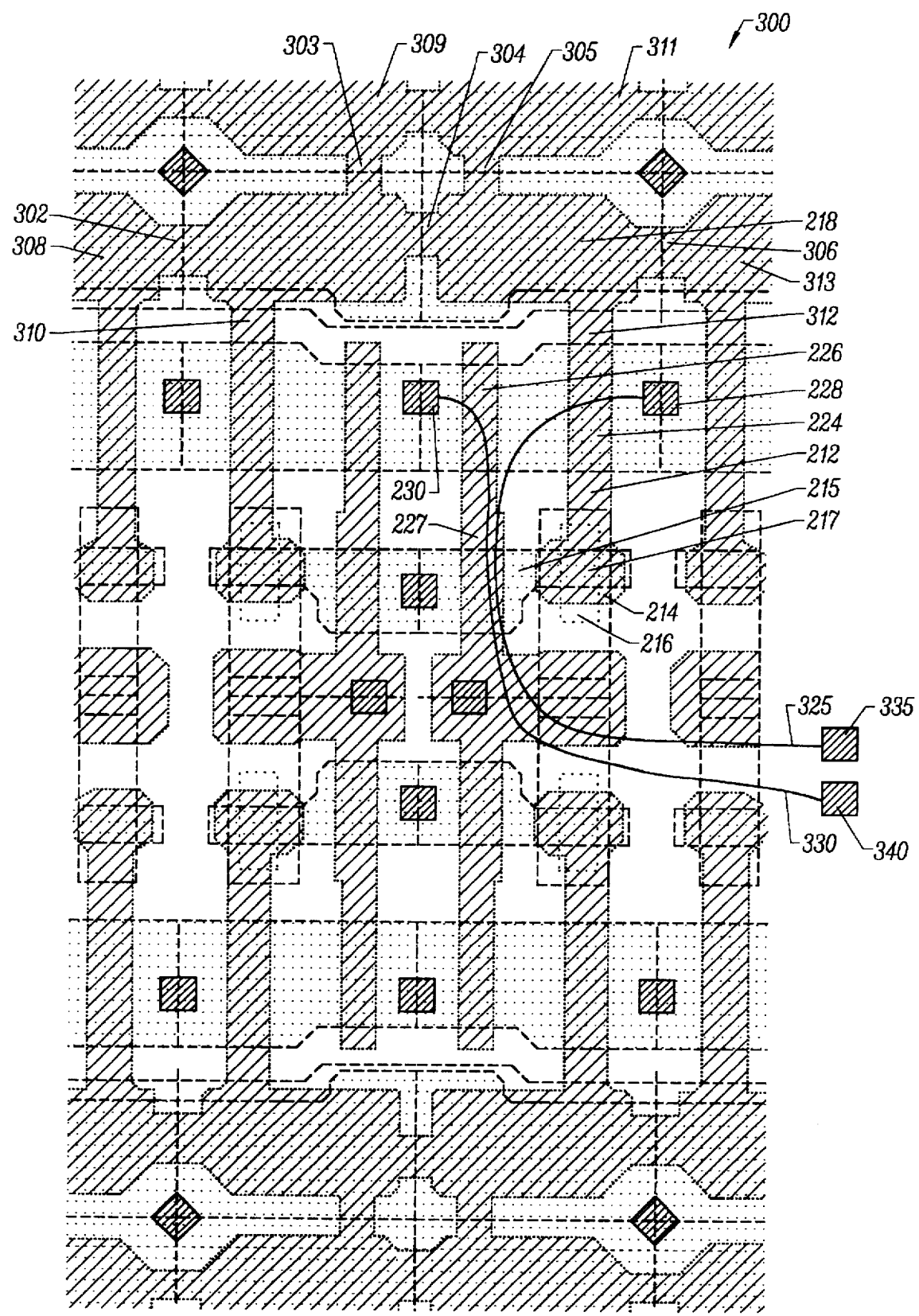
Figure 4:
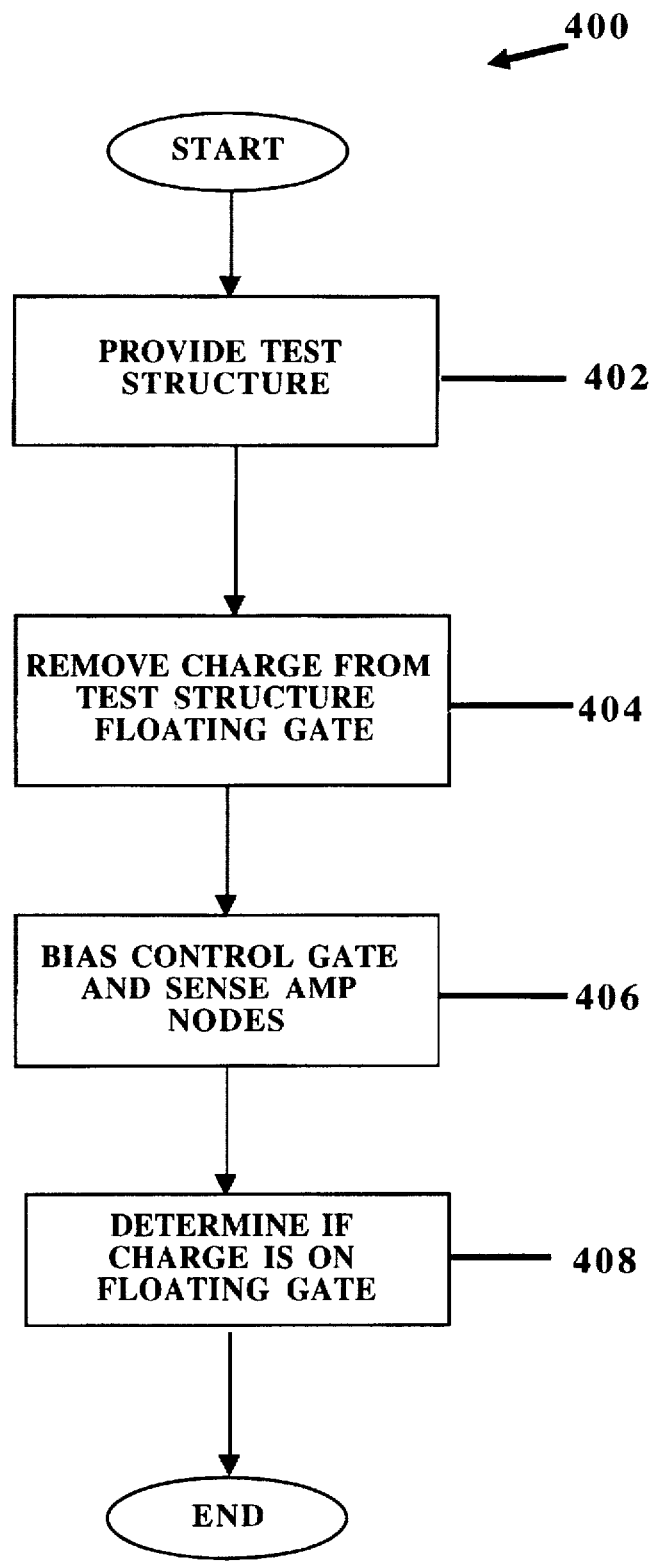
FIG. 4 is a flow chart of the process of the testing memory cells in accordance with the present invention.

FIG. 3 shows a preferred embodiment of the present invention. The EEPROM array of FIG. 2 has been adapted to form a test structure 300. The test structure 300 is the same as the array of FIG. 2, but for the addition of polysilicon linkers, e.g., 302, 303, 304, 305, 306, which join the floating gates, e.g., 308, 309, 310, 311, 312, 313, of two or more individual cells of the array into a single common floating gate 315.

In general, the conductive connections between floating gates can take any form and be provided to any location on floating gates. As illustrated in FIG. 3, the conductive connections are made between the control gate portions of the floating gates. When implemented with polysilicon, this design requires only very minor modification from a conventional fabrication flow - - - only the reticle for the polysilicon mask must be altered. Other options include connecting the tunneling ends of the floating gates by polysilicon linkers, and connecting any portions of the floating gates by metal 1 connectors.

Using structure 300, the cells of the array may be tested by first generating a low threshold voltage (Vt) state in which all or most electrons are removed from the common floating gate. The floating gate is now susceptible to charge gain if any charge gain type defects are present. Next, a bias is applied at the same or comparable electrical conditions to be applied in the proposed product. Or, in order that the results of the test may be extrapolated to an expected lifetime of ten or more years for the device, an even more rigorous test may be administered by applying a higher bias and/or temperatures than anticipated for the proposed product. In order to make biasing the entire array easier, the inputs from the individual cells can be tied together (e.g., all sense amps positive (SA+s) together, all sense amps negative (SA−s) together, all control gates (CGs) together, etc.). In this way, a common electrical bias may be easily applied to all cells of the test array as a group.

With a common floating gate, any cell of the array with a defect permitting charge to leak onto its floating gate will produce an increase in the common floating gate charge. The increased charge will disperse over the entire common floating structure, so that it can be detected at any and all locations on the common structure. If any one or more cells of the array is defective, electrons leaking onto the floating gate will reduce the electric potential between the two electrodes of any cell. The bit that leaks the most charge through the oxide will control the final floating gate charge and, therefore, the array voltage.

The charge gain on the floating gate can be detected in a variety of ways. In a preferred embodiment of the present invention, the voltage on the floating gate can be determined by using the common floating gate as the gate of an isolated MOSFET. In this approach, illustrated in FIG. 3A, the common floating gate 315 is provided with a portion 320 that extends outside of the region defined by the array. That portion serves as a gate for the isolated MOSFET. When electrons leak onto the common floating gate - - - indicating a charge gain defect somewhere in the array - - - the gate portion of the isolated MOSFET becomes negatively charged. This will create or remove an inversion region in a FET channel, thereby allowing charge gain to be detected.

Alternatively, the current at one of the EEPROM cells of the test array may be measured directly. In this case, illustrated in FIG. 3B, direct electrical connections 325 and 330 to pads 335 and 340, respectively are provided in the place of sense amplifiers. Voltage may be applied to a word line, and the current can then be measured as the control gate voltage is changed. If the current remains unexpectedly low as the control gate voltage increases, then charge gain has occurred at some cell.

Since sense amplifiers are not required for either of these detection methods, the methods may be used during the design phase of the array before the device design is completed, i.e., before the sense amplifiers and other elements are completely wired to the basic cell array. Conventional voltage or current measuring devices—which express current as a function of voltage—either as running through an isolated MOS or one or more cells of the array for a given voltage on the drain, may be used.

In a third alternative, the complete array is tested using the existing sense amplifiers and associated circuitry. However, the optimal advantage of the present invention is achieved when the testing is performed before the full product is complete. The sense amplifiers and associated circuitry will generally not yet exist at this stage of the product design and manufacture.

A preferred testing method 400 of the present invention is illustrated in the flowchart. In a step 402, a test structure is provided which has the same design as the proposed product with the addition of linkers to join the floating gates of the non-volatile cells of the array to be tested into a common floating gate. Next, in a step 404, the charge is removed from the common floating gate of the test structure. This maximizes the likelihood that charge will leak across any defect and onto the common floating gate. In a step 406 at least the same or comparable electrical bias conditions to be applied in the proposed product are applied to the test structure, i.e., the control gates and sense amp nodes are positively biased. In a preferred embodiment of the present invention, the control gates (particularly from different columns of the array) and, separately, the sense amps of the cells of the array to be tested are tied together to facilitate this biasing step. This allows a single control point to apply the same bias to all relevant points on the array. Finally, in a step 408, a determination is made as to whether charge gain has occurred on the floating gate. The determination of step 408 may be made by using a variety of different methods and apparatuses, as described above.

It is not necessary that the method and test structure of the present invention be able to locate the particular cell or cells of the array which are defective. It is sufficient to know that the design or process results in a defective product; the product can then be redesigned and tested prior to going into production.

Figure 5A:
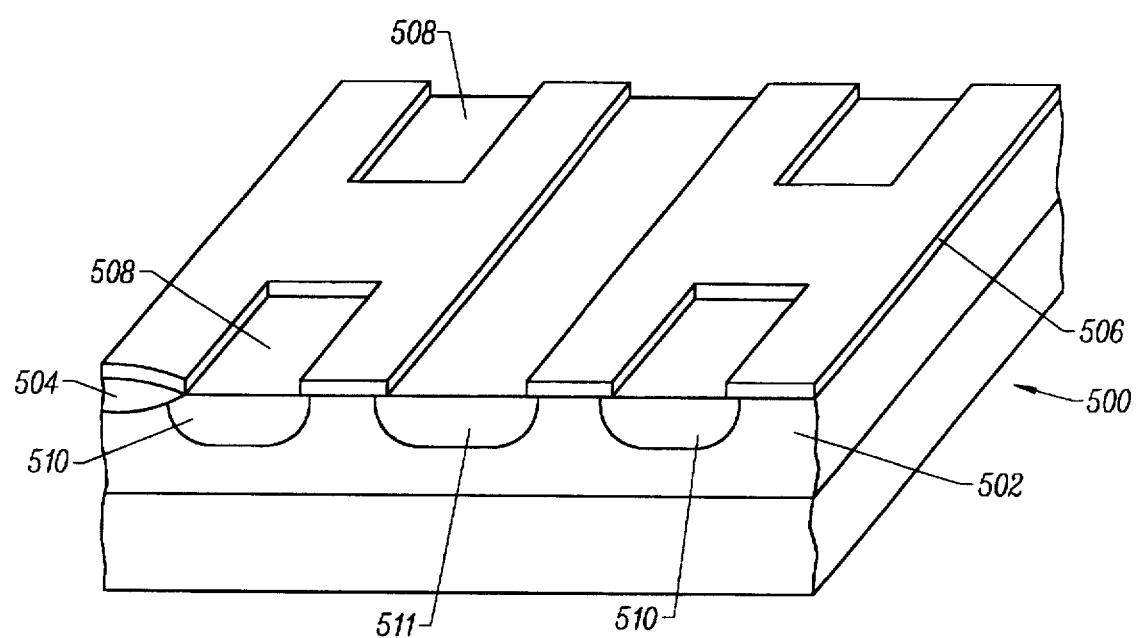
FIGS. 5A–C show a perspective view of simplified discrete process steps in the fabrication of the test structure of the present invention.
Figure 5B:
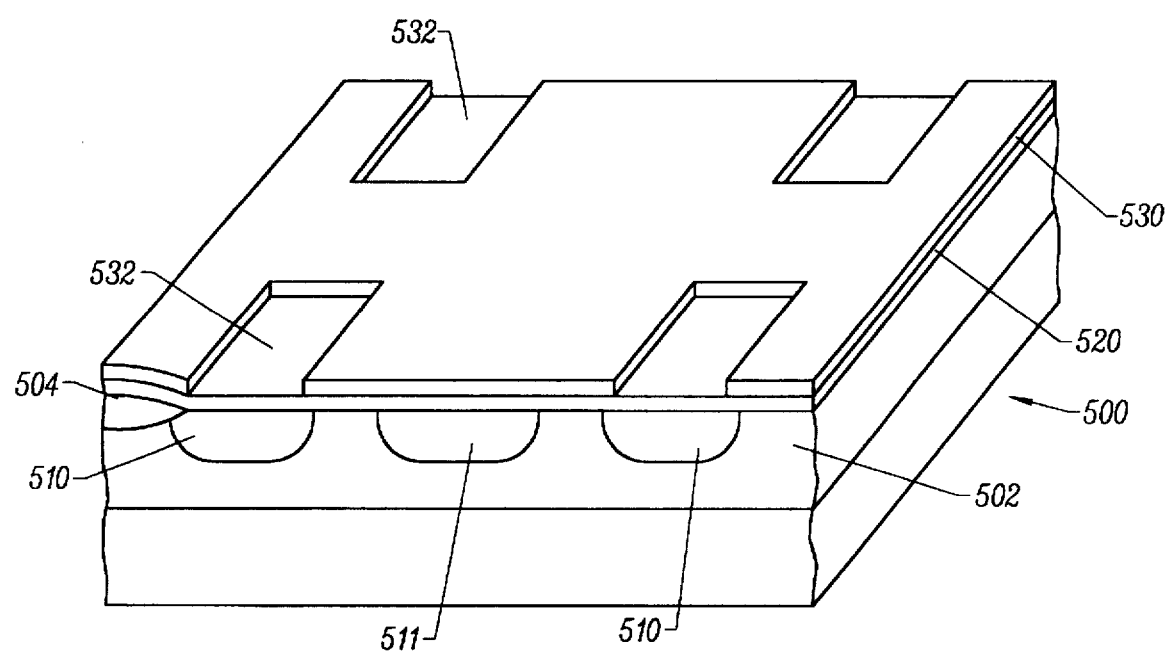
Figure 5C:
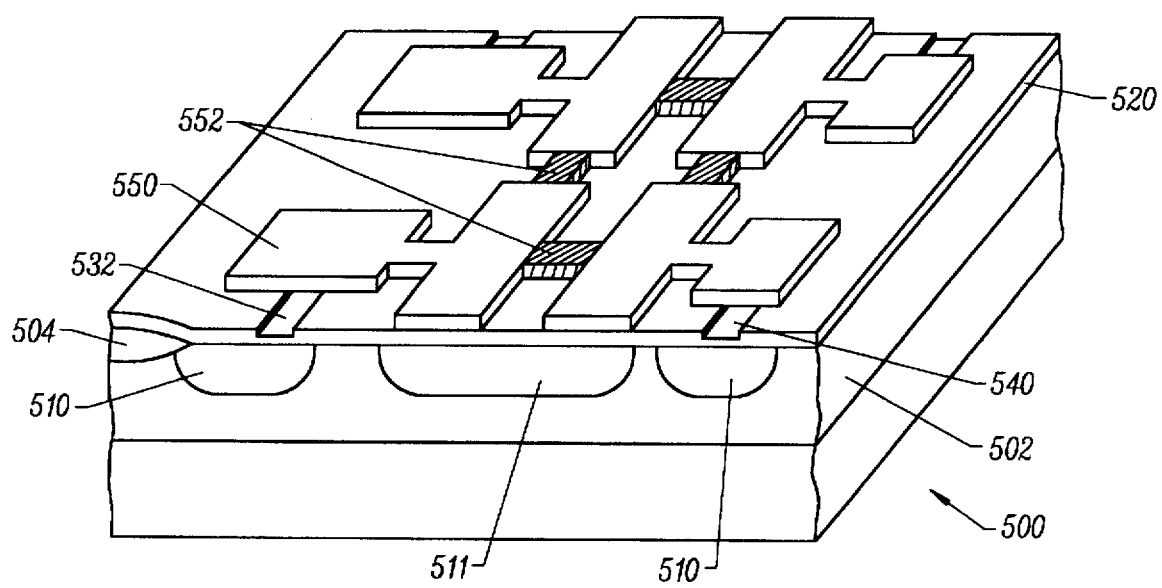

The test structures of the present invention may be manufactured according to methods well known in the integrated circuit fabrication art. FIGS. 5A–C show some discrete steps in the fabrication process in a simplified form. It should be understood that numerous variations of this process are permissible and within the scope of this invention. Further, although this process is described as a sequence of steps in which an n-type memory diffusion is formed, the process could equally be applied to form a test structure having p-type memory diffusion if the conductivity types of the dopants employed in the various steps, particularly the step of forming the memory diffusions underlying the tunnel window and control gate, are reversed.

FIG. 5A shows a semiconductor substrate 500 which has been prepared for processing by ion implantation to form a lightly doped p-well 502, and growth of field oxide 504 over those regions of the substrate 500 which will be inactive. A layer of photoresist 506 has been applied to the surface of the substrate 500 and patterned for memory diffusion ion implantation. Then an n-type ion implant is performed over the substrate, penetrating the exposed substrate at exposed regions 508 to create regions underlying the substrate surface that have an n-type conductivity ("memory diffusion" or "MD" regions 510). The implant also penetrates exposed substrate region 509 to create control gate diffusion 511. In one conventional process, the n-type dopants phosphorus and arsenic may be provided at doses of between about $1\times10^{14}$ to $1\times10^{15}$ and $7\times10^{14}$ to $7\times10^{15}$, respectively, at an energy of about 80 to 120 keV and 60 to 80 keV, respectively, which is sufficient to provide highly doped MD 510 and control gate 511 regions. In one example, this implant produces an n-type dopant concentration of about $1\times10^{19}$ to $1\times10^{20}$ cm–3 in the MD regions immediately under the substrate surface. These areas will act as sources/drains in the completed device. Following this n-type ion implant step, the photoresist 506 is removed.

Following this ion implantation step, an anneal is generally performed in order to drive the ions into the substrate and recrystallize the lattice prior to growth of an oxide over the MD and control gate diffusions. Variations of conditions used during this anneal can cause defects in the tunnel oxide and elsewhere resulting in potential charge gain and, therefore, an unacceptable product. Another example of a process step in which problems can cause defects that result in charge gain is the cleaning of the substrate surface prior to growth of the oxide. These fabrication process induced defects, together with inherent design flaws are among the defects that can be identified by the method and apparatus of the present invention. The invention is also useful for testing the proper operation of new or modified equipment used in the fabrication process, i.e., polysilicon etchers.

Next, as shown in FIG. 5B, a thin gate oxide 520 is grown on the bare silicon surface in an oxygen-containing atmosphere at a temperature of between about 800° and 950° C. for about six to ten minutes, to produce a thickness of between about 125 and 190 Å over the substrate surface. Typically, the gate oxide 520 will be a single layer of silicon dioxide, but it may also be a multi-layer structure including silicon nitride. (Technically, such multi-layer structures should be referred to as "gate dielectrics" rather than merely "gate oxides"). After the gate oxide or gate dielectric has been formed, a photoresist mask 530 is applied and patterned for the tunnel oxide regions 532, which at least partly overly the MD regions 510. After the mask 530 is formed, an etch (e.g., a HF wet etch) is used to remove the gate oxide in the exposed tunnel oxide regions 532.

Next, the photoresist 530 used during the most recent etch step is removed. A tunnel oxide layer 540 is grown over the bare silicon surface regions 532 created by the etch. The tunnel oxide 540 may be generated by thermal oxidation at 850° to 950° C. for about seven minutes in a dry $O_2/Cl$ atmosphere so that the bare silicon surface in the regions 532 is converted to an oxide layer of about 70 to 100 Å in thickness. This thermal oxidation will further increase the thickness of the gate oxide layer to about 160 to 200 Å over the MD regions 510, and 145 to 190 Å over the well 502. In order to form the floating gate, a blanket of polysilicon (not shown) approximately 1000 to 2000 Å in thickness is deposited over the device surface by, for example, chemical vapor deposition. The polysilicon layer may be followed by a silicide (e.g., $WSi_2$) layer (not shown) of about 1000 to 2000 Å.

To produce the structure of FIG. 5C, a photoresist mask (not shown) is formed on the surface of polysilicon layer formed over the surface of the device and patterned to form a floating gate 550 overlapping all of the tunnel oxide regions 532 on the substrate surface. Once the mask is in place, an etch is used to remove the unmasked polysilicon. An example of a suitable etch is a reactive ion etch (RIE) using $SF_6/Cl_2$. This etch is highly selective to polysilicon over $SiO_2$, approximately 20–100:1, so as to minimize the amount of tunnel oxide removed during the polysilicon etch. Once the mask is removed, a floating gate 550 common the all of the cells of the array on the silicon substrate remains. The common floating gate 550 includes linkers 552 (shown in darker cross-hatching) connecting the separate floating gates of the individual cells of the array.

Of course this test structure and method can easily be extended to other non-volatile memories, such EPROM and FLASH cells, with appropriate adaptations which would be obvious to those of skill in the art form the foregoing description with regard to EEPROMs. Specifically, the floating gates in individual EPROM and FLASH cells could be linked to floating gates in adjacent cells by polysilicon jumpers (linkers), for example.

Although a specific embodiment of the present invention has been described in detail, it should be understood that the present invention may be embodied in many other specific forms without departing from the spirit or scope of the invention as recited in the claims.

What is claimed is:

1. A structure for testing at least a portion of an array of non-volatile memory cells, said structure comprising:

a substrate including diffusion regions at least partially defining individual cells of said array of non-volatile memory cells;

one or more dielectric layers formed on said substrate; and a floating gate spanning two or more of said individual cells and including charge transfer regions in each of two or more cells, wherein a defect proximate any of said charge transfer regions facilitates charge transfer from the substrate through said one or more dielectric layers and onto said floating gate, and wherein a charge build up on said floating gate indicates that said defect exists.

2. The structure of claim 1, further comprising a gate charge detection mechanism capable of sensing charge build up on said floating gate, whereby when said detection mechanism detects a charge build up, said defect exists.

3. The structure of claim 2, wherein said gate charge detection mechanism comprises an isolated MOS transistor having for its gate the floating gate of said array.

4. The structure of claim 2, wherein said gate charge detection mechanism comprises one or more cells of said array.

5. The structure of claim 2, wherein said array further comprises sense amplifiers and said gate charge detection mechanism comprises pads coupled to the sense amplifiers of said array.

6. The structure of non-volatile memory cells of claim 1, wherein said array is an array of EEPROM cells.

7. The structure of non-volatile memory cells of claim 6, wherein the charge transfer region includes a tunnel window overlaying a memory diffusion in said substrate.

8. The structure of non-volatile memory cells of claim 1, wherein said array is an array of EPROM cells.

9. The structure of non-volatile memory cells of claim 8, wherein the charge transfer region includes a gate oxide and a source implant in said substrate.

10. The structure of non-volatile memory cells of claim 1, wherein said array includes multiple flash memory cells.

11. A method of testing at least a portion of an array of non-volatile memory cells, said method comprising the following:

providing said array including a floating gate spanning two or more individual cells of said array and including charge transfer regions in each of said two or more cells;

providing said floating gate in a state in which charge is substantially removed from said floating gate;

biasing one or more diffusion regions in a substrate of said array, which diffusion regions are capacitively coupled to said floating gate; and determining if charge has built up on said floating gate, wherein a defect proximate any one of said charge transfer regions facilitates charge transfer from said substrate through a dielectric layer and on to said floating gate, and wherein a charge build up on said floating gate indicates that said defect exists.

12. The method of claim 11, wherein said step of determining if charge has built up on said floating gate comprises reading an isolated MOS transistor having for its gate the floating gate of said array.

13. The method of claim 11, wherein said step of determining if charge has built up on said floating gate comprises reading one or more cells of said array.

14. The method of claim 11, wherein said step of determining if charge has built up on said floating gate comprises reading pads coupled to sense amplifiers comprised in said array.

15. The method of claim 11, wherein said array is an array of EEPROM cells.

16. The method of claim 11, wherein said array is an array of EPROM cells.

17. The method of claim 11, wherein said array includes multiple flash memory cells.

18. A structure for testing one or more conditions in a process for fabricating an array of EEPROM memory cells, said test structure comprising:

a substrate including diffusion regions defining at least portions of individual cells of a second array of non-volatile memory cells having the same design as at least a portion of said EEPROM array to be tested;

at least one gate oxide overlying said substrate; and a floating gate spanning two or more of said individual cells and including tunnel oxide regions in each of two or more cells, wherein a defect proximate any of said tunnel oxide regions facilitates charge transfer from substrate through either of said gate or said tunnel oxide regions and onto said floating gate; and a gate charge detection mechanism capable of sensing charge build up on said floating gate, whereby when said detection mechanism detects a charge build up, said defect exists.

19. The structure of claim 18, wherein said gate charge detection mechanism comprises an isolated MOS transistor having for its gate the floating gate of said array, whereby a charge build up on said floating gate activates said MOS transistor to indicate said defect exists.

20. A method of testing one or more conditions in a process for fabricating an array EEPROM memory cells, said method comprising the following:

providing said array including a floating gate spanning two or more individual cells of said array and including tunnel oxide regions in each of said two or more cells;

providing said floating gate in a state in which charge is substantially removed from said floating gate;

biasing one or more diffusion regions in a substrate of said array, which diffusion regions are capacitively coupled to said floating gate; and reading a gate charge detection mechanism capable of sensing charge build up on said floating gate, whereby when said detection mechanism detects a charge build up, said defect exists.

21. The method of claim 20, wherein said gate charge detection mechanism comprises an isolated MOS transistor having for its gate the floating gate of said array, whereby a charge build up on said floating gate activates said MOS transistor to indicate that a defect exists.

* * * * *